(12) United States Patent
Liu

(10) Patent No.: US 12,163,248 B2
(45) Date of Patent: Dec. 10, 2024

(54) QUANTITATIVE TEXTURED POLYCRYSTALLINE COATINGS

(71) Applicant: Kennametal Inc., Latrobe, PA (US)

(72) Inventor: Zhenyu Liu, Greensburg, PA (US)

(73) Assignee: KENNAMETAL INC., Latrobe, PA (US)

( * ) Notice: Subject to any disclaimer, the term of this patent is extended or adjusted under 35 U.S.C. 154(b) by 100 days.

(21) Appl. No.: 17/611,748

(22) PCT Filed: May 15, 2020

(86) PCT No.: PCT/US2020/033026
§ 371 (c)(1),
(2) Date: Nov. 16, 2021

(87) PCT Pub. No.: WO2020/236541
PCT Pub. Date: Nov. 26, 2020

(65) Prior Publication Data
US 2022/0235487 A1 Jul. 28, 2022

Related U.S. Application Data

(60) Provisional application No. 62/850,953, filed on May 21, 2019.

(51) Int. Cl.
*C30B 28/14* (2006.01)
*C30B 29/20* (2006.01)
(Continued)

(52) U.S. Cl.
CPC .............. *C30B 28/14* (2013.01); *C30B 29/20* (2013.01); *C30B 29/36* (2013.01); *C30B 29/38* (2013.01)

(58) Field of Classification Search
CPC .......... C30B 28/14; C30B 29/20; C30B 29/36; C30B 29/38
See application file for complete search history.

(56) References Cited

U.S. PATENT DOCUMENTS

| 4,012,204 A | 3/1977 | Riewald et al. |
| 5,952,102 A | 9/1999 | Cutler |

(Continued)

FOREIGN PATENT DOCUMENTS

| CN | 102449186 A | 5/2012 |
| CN | 105671519 A | 6/2016 |

(Continued)

OTHER PUBLICATIONS

Gadds, Bruker, Intro into 2D Diffraction pp. 1-8.*
(Continued)

*Primary Examiner* — Robert M Kunemund
(74) *Attorney, Agent, or Firm* — Christopher J. Owens

(57) ABSTRACT

In one aspect, methods of making coated articles are described herein. A method, in some embodiments, comprises providing a substrate, and depositing a coating by chemical vapor deposition (CVD) and/or physical vapor deposition (PVD) over a surface of the substrate, the coating comprising at least one polycrystalline layer, wherein one or more CVD and/or PVD conditions are selected to induce one or more properties of the polycrystalline layer. The presence of the one or more properties in the polycrystalline layer is quantified by two-dimensional (2D) X-ray diffraction analysis.

14 Claims, 3 Drawing Sheets

(51) Int. Cl.
*C30B 29/36* (2006.01)
*C30B 29/38* (2006.01)

(56) References Cited

U.S. PATENT DOCUMENTS

| | | |
|---|---|---|
| 2007/0148498 A1 | 6/2007 | Park et al. |
| 2011/0039685 A1* | 2/2011 | Mao ............ C04B 35/6455 501/153 |
| 2012/0015148 A1 | 1/2012 | Ruppi |
| 2012/0223449 A1* | 9/2012 | Mao ............ C04B 35/6455 264/1.36 |
| 2014/0193624 A1 | 7/2014 | Walter |
| 2017/0096372 A1 | 4/2017 | Liu et al. |
| 2017/0191169 A1 | 7/2017 | Imamura et al. |

FOREIGN PATENT DOCUMENTS

| | | |
|---|---|---|
| CN | 107534074 A | 1/2018 |
| CN | 108977808 A | 12/2018 |
| JP | 2004359495 * | 1/2004 |
| WO | 2005061400 A1 | 7/2005 |
| WO | 2018018161 A1 | 2/2018 |

OTHER PUBLICATIONS

International Preliminary Report on Patentability for International Application No. PCT/US2020/033026, mailed Dec. 2, 2021, 9 Pages.

International Search Report and Written Opinion corresponding to PCT/US2020/033026, mailed Aug. 31, 2020, 10 pages.

Dec. 27, 2023 Foreign Office Action Chinese Application No. CN202080036673.6, P19-06415-CN-PCT, 39 Pages.

Steyer, P., et al., "Improvement of High Temperature Corrosion Resistance of Tool Steels by Nanostructured PVD Coatings," Materials Science Forum, Aug. 2003, vol. 426-432, pp. 2503-2508.

Xin, Y.K., et al., "Preparation and Properties of Polycrystalline Silicon Thin Films With (220)/(400) Selective Orientation on Graphite Substrates," Functional Materials, Feb. 2015, vol. 46(4), pp. 4153-4158.

* cited by examiner

QUANTITATIVE TEXTURED POLYCRYSTALLINE COATINGS

RELATED APPLICATION DATA

The present application is a U.S. National Phase of PCT/US2020/033026, filed May 15, 2020, which claims priority pursuant to Article 8 of the Patent Cooperation Treaty to U.S. Provisional Patent Application Ser. No. 62/850,953, filed May 21, 2019, each are incorporated herein by reference in their entireties.

FIELD

The present invention relates to refractory coatings and, in particular, to quantitative textured polycrystalline layers of refractory coatings.

BACKGROUND

Cutting tools, including cemented carbide cutting tools, have been used in both coated and uncoated conditions for machining various metals and alloys. In order to increase cutting tool wear resistance, performance and lifetime, one or more layers of refractory material have been applied to cutting tool surfaces. TiC, TiCN, TiN and/or $Al_2O_3$, for example, have been applied to cemented carbide substrates by chemical vapor deposition (CVD) and by physical vapor deposition (PVD). While effective in inhibiting wear and extending tool lifetime in a variety of applications, refractory coatings based on single or multi-layer constructions of the foregoing refractory materials have increasingly reached their performance limits, thereby calling for the development of new coating architectures for cutting tools, including coatings having various textures and grain orientations for enhanced performance.

However, significant issues exist with proper characterization of coating architectures and related properties. Current analytical methods are qualitative and subjective in nature, wherein coating characterization is largely dependent on specific data sets selected by the lab. Texture coefficient of a polycrystalline layer measured by the Harris equation is one of many examples where a coating property can vary significantly based on user input. The Harris equation is $$TC(hkl) = \frac{I(hkl)}{I_0(hkl)} \left\{ \frac{1}{N} \sum \frac{I(hkl)}{I_0(hkl)} \right\}^{-1}$$

where I(hkl) is the measured intensity of the (hkl) reflection, $I_0$(hkl) is the powder diffraction intensity according to the PDF reference card from the International Center for Diffraction Data (ICDD) and N is the number of reflections used in the calculation.

Based on this equation and associated underlying assumptions, the texture coefficient is the average intensity ratio difference from the experimental versus the reference. It is noted that the texture evaluation is arbitrary due to the subjective selection of references and numbers of reflection peaks. Different references will lead to different reflection peak intensity, and thus the deviation of final calculation of texture coefficient. Another concern is that there are many peaks in a polycrystalline layer such as alumina. Therefore, the operator is required to select the number of reflection peaks for the texture analysis. Some operators select 6 peaks, some operators select 8 peaks and some operators select even more peaks for the calculation. Due to the subjective selection of these numerous input parameters, the calculated texture coefficient value is only of relative meaning and is not fully quantitative. The texture coefficient for a polycrystalline layer can vary significantly based on the input data, especially when characterizing the "maximum" texture coefficient which is based on the number of reflections used in the calculation (N). For example, the maximum texture coefficient will be 5 if the operator selects 5 reflections; it will be 8 if the operator selects 8 reflections and so forth from the Harris equation. Accordingly, texture coefficient based on the Harris formula can only draw qualitative, not fully quantitative, meaningful conclusions regarding coating architecture and related coating performance. Such limitations also preclude accurate description of crystal evolution in polycrystalline coatings.

SUMMARY

In view of the foregoing, quantitative methods of polycrystalline coating development and characterization are needed for understanding coating architecture and coating performance properties. In one aspect, methods of making coated articles are described herein. A method, in some embodiments, comprises providing a substrate, and depositing a coating by CVD and/or PVD over a surface of the substrate, the coating comprising at least one polycrystalline layer, wherein one or more CVD and/or PVD conditions are selected to induce one or more properties of the polycrystalline layer. The presence of the one or more properties in the polycrystalline layer is quantified by two-dimensional (2D) X-ray diffraction analysis. In some embodiments, the method further comprises quantifying the presence of the one or more properties of the polycrystalline layer by electron backscatter diffraction (EBSD). As described further herein, one or more of the CVD or PVD parameters or conditions can be adjusted in response to quantification of the one or more properties by the 2D X-ray analysis. Properties of the polycrystalline layer induced by the deposition conditions and quantified by the 2D X-ray analysis are not limited and may be selected according to various considerations, including compositional identity of the polycrystalline layer and desired properties of the polycrystalline layer. In some embodiments, for example, the one or more properties include grain orientation in the polycrystalline layer and/or residual stress of the polycrystalline layer.

In another aspect, coated articles are provided. As described further herein, properties of the coated articles can be induced by the associated CVD or PVD parameters and quantified by 2D X-ray diffraction. A coated article, for example, comprises a substrate and a coating comprising a layer of alumina deposited by CVD over the substrate, wherein less than 50 volume percent of the grains of the alumina layer exhibit random orientation. In some embodiments, greater than 30 volume percent of the grains of the alumina layer exhibit fiber orientation. Additionally, grains of the alumina layer can exhibit one or more preferred orientations, including the (006) growth (e.g. 0001 or basal plane) direction. In some embodiments, for example, 15-50 volume percent of the grains in the alumina layer exhibit (006) texture.

In addition to grain orientation properties, the alumina layer can exhibit various levels of residual stress depending on CVD parameters or conditions, the residual stress quantified by 2D X-ray diffraction. In some embodiments, the alumina layer exhibits a residual stress of 0.2 GPa to −3 GPa. As is known to the skilled artisan, a positive value for residual stress indicates tensile stress whereas a negative value indicates compressive stress.

These and other embodiments are further described in the following detailed description.

DETAILED DESCRIPTION

Figure 1:
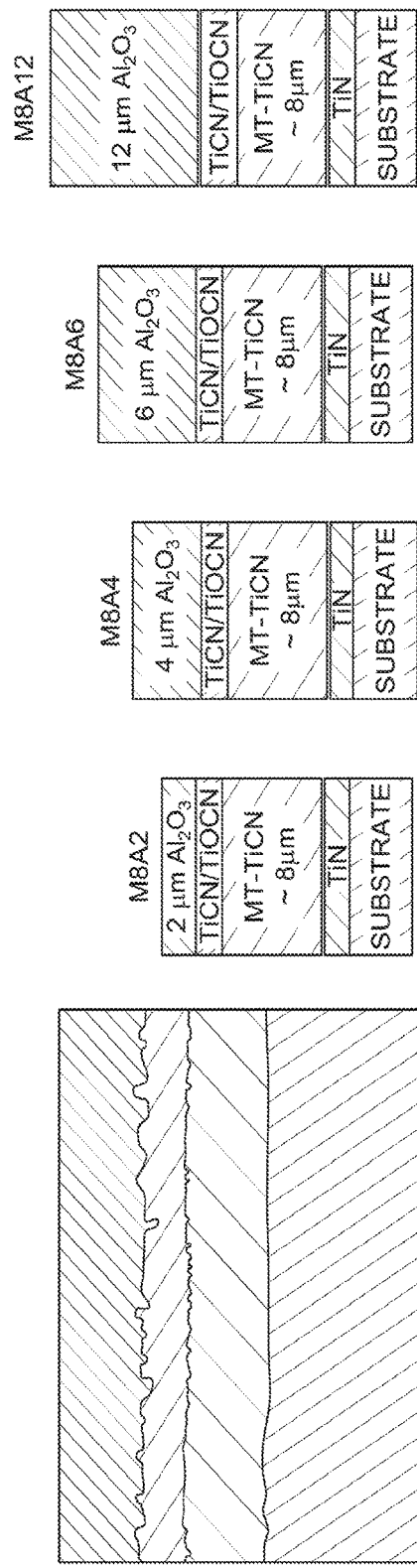
FIG. 1 provides a cross-sectional scanning electron micrograph (SEM) of a coated substrate and schematics of each coated substrate detailed in the Example herein.

Embodiments described herein can be understood more readily by reference to the following detailed description and examples and their previous and following descriptions. Elements, apparatus and methods described herein, however, are not limited to the specific embodiments presented in the detailed description and examples. It should be recognized that these embodiments are merely illustrative of the principles of the present invention. Numerous modifications and adaptations will be readily apparent to those of skill in the art without departing from the spirit and scope of the invention.

In one aspect, methods of making coated articles are described herein. A method, in some embodiments, comprises providing a substrate, and depositing a coating by CVD and/or PVD over a surface of the substrate, the coating comprising at least one polycrystalline layer, wherein one or more CVD and/or PVD conditions are selected to induce one or more properties of the polycrystalline layer. The presence of the one or more properties in the polycrystalline layer is quantified by the 2D X-ray diffraction analysis. In some embodiments, the method further comprises quantifying the presence of the one or more properties of the polycrystalline layer by EBSD.

As described further herein, one or more of the CVD or PVD parameters or conditions can be adjusted in response to quantification of the one or more properties by the 2D X-ray analysis. In some embodiments, for example, the one or more properties of the polycrystalline layer are not detected by the 2D X-ray analysis or are not present in the polycrystalline layer at the desired level. CVD or PVD parameters may be adjusted until the one or more properties are achieved in the polycrystalline layer at the desired level. Adjustment of CVD or PVD parameters to induce the desired properties in the polycrystalline may require an iterative process wherein samples of the polycrystalline layer are deposited and subsequently analyzed by the 2D X-ray analysis. This iterative process can yield information regarding property evolution in the polycrystalline layer relative to various deposition parameters. In this way, a library can be developed for deposition conditions to induce desired coating architectures.

Properties of the polycrystalline layer induced by the deposition conditions and quantified by the 2D X-ray analysis are not limited and may be selected according to various considerations including compositional identity of the polycrystalline layer and desired properties of the polycrystalline layer. In some embodiments, for example, the one or more properties include grain orientation in the polycrystalline layer and/or residual stress of the polycrystalline layer. Moreover, one or more CVD parameters that may be varied or adjusted to induce or achieve a desired property in the polycrystalline layer can include reactant partial pressures, gas flow rates into and out of the CVD reactor, CVD reactor temperature, deposition/growth rate of the polycrystalline and/or deposition time of the polycrystalline layer. One or more PVD parameters that may be varied can include cathode composition, substrate bias voltage, cathode arrangement relative to the substrate, cathode and/or substrate rotation, substrate temperature, deposition/growth rate of the polycrystalline and/or deposition time of the polycrystalline layer.

In some embodiments, for example, one or more deposition conditions are selected to control random grain orientation of the polycrystalline layer. Less than 50 volume percent of the grains of the polycrystalline layer can exhibit random orientation, in some embodiments. Deposition conditions can also control fiber orientation of the grains in the polycrystalline layer. Fiber orientation, as used herein, refers to grains having one crystallographic axis parallel to the substrate normal. In some embodiments, greater than 30 volume percent of the grains, such as 30-90 volume percent, exhibit fiber orientation. Further, deposition conditions can also control one or more preferred grain orientations in the polycrystalline layer, including the (006) orientation. In some embodiments, for example, 10-95 volume percent or 15-50 volume percent of the grains in the alumina layer exhibit (006) texture.

In addition to controlling grain orientation as quantified by the 2D X-ray analysis, deposition parameters can also control residual stress of the polycrystalline layer. In some embodiments, residual stress of the polycrystalline layer ranges from 0.2 GPa to −3 GPa.

Polycrystalline layers of methods and compositions described herein can have any desired composition. In some embodiments, the polycrystalline layers are formed of refractory ceramic materials including metal oxides, nitrides, carbides, carbonitrides, or oxycarbonitrides. The polycrystalline layer can comprise one or more metallic elements selected from the group consisting of aluminum and metallic elements of Groups IVB, VB and VIB of the Periodic Table and one or more non-metallic elements selected from the group consisting of non-metallic elements of Groups IIIA, IVA, VA and VIA of the Periodic Table. In some embodiments, for example, the polycrystalline layer comprises alumina, such as alpha-alumina, kappa-alumina or mixtures thereof. Additionally, coatings described herein can comprise a single polycrystalline layer or multiple polycrystalline layers. Layer thickness of a single polycrystalline layer can generally range from 0.5 µm to 20 µm.

Coated articles according to methods described herein can comprise any substrate not inconsistent with the objectives of the present invention. For example, a substrate can be a cutting tool or tooling used in wear applications. Cutting tools include, but are not limited to, indexable cutting inserts, end mills or drills. Indexable cutting inserts can have any desired ANSI standard geometry for milling or turning applications. Substrates of coated articles described herein can be formed of cemented carbide, carbide, ceramic, cermet, steel or other alloy. A cemented carbide substrate, in some embodiments, comprises tungsten carbide (WC). WC can be present in a cutting tool substrate in an amount of at least about 80 weight percent or in an amount of at least about 85 weight percent. Additionally, metallic binder of cemented carbide can comprise cobalt or cobalt alloy. Cobalt, for example, can be present in a cemented carbide substrate in an amount ranging from 1 weight percent to 15 weight percent. In some embodiments, cobalt is present in a cemented carbide substrate in an amount ranging from 5-12 weight percent or from 6-10 weight percent. Further, a cemented carbide substrate may exhibit a zone of binder enrichment beginning at and extending inwardly from the surface of the substrate.

Cemented carbide substrates can also comprise one or more additives such as, for example, one or more of the following elements and/or their compounds: titanium, niobium, vanadium, tantalum, chromium, zirconium and/or hafnium. In some embodiments, titanium, niobium, vanadium, tantalum, chromium, zirconium and/or hafnium form solid solution carbides with WC of the substrate. In such embodiments, the substrate can comprise one or more solid solution carbides in an amount ranging from 0.1-5 weight percent. Additionally, a cemented carbide substrate can comprise nitrogen.

These and other embodiments are further illustrated in the following non-limiting examples.

Example 1—Control of Residual Stress and Grain Orientation Via 2D-XRD

Four cemented carbide substrates of the same grade were coated provided CVD coatings according to Table I.

TABLE I

Coated cemented carbide substrates

| Coating Structure | Coating Sample | | | |
|---|---|---|---|---|
|  | M8A2 | M8A4 | M8A6 | M8A12 |
| TiN (μm) | 0.3 | 0.7 | 0.2 | 0.3 |
| MT-TiCN (μm) | 8.6 | 8.3 | 8.5 | 7.8 |
| HT-TiCN (μm) | 1.6 | 1.2 | 1.1 | 1.2 |
| $Al_2O_3$ (μm) | 1.7 | 3.7 | 5.8 | 12.1 |
| Total (μm) | 12.3 | 13.9 | 15.6 | 21.5 |

As provided in Table I, only the thickness of the $Al_2O_3$ layer was varied, with the remaining layers exhibiting substantially the similar thicknesses across the samples under the same deposition conditions. FIG. 1 provides a cross-sectional scanning electron micrograph of a coated substrate and schematics of each coated substrate according to Table I. Each coating was deposited according to the parameters of Tables II and III with the principal difference being the deposition time of the $Al_2O_3$ layer to achieve thickness values listed in Table I. Deposition times for the $Al_2O_3$ layer ranged from 1.8 to 10 hours at a rate of 1-1.5 μm/hr. For enhanced adhesion, a bonding layer including HT-TiCN and TiOCN is adjacent to the $Al_2O_3$ layer.

TABLE III

CVD Deposition Steps

| Process Step | Temperature ° C. | Pressure mbar | Time min. |
|---|---|---|---|
| TiN | 850-960 | 60-90 | 10-90 |
| MT-TiCN | 900-940 | 70-100 | 50-400 |
| HT-TiCN | 900-1050 | 60-150 | 30-200 |
| TiOCN | 950-1050 | 200-500 | 30-70 |
| $Al_2O_3$ | 950-1050 | 50-120 | 10-750 |

Data collection for the $Al_2O_3$ layer residual stress and grain orientation/texture was performed on a Bruker D8 diffractometer with the general area detector diffraction systemHI-STAR GADDS and a rotating anode, operating at 40 kV and 20 mA. The core of the GADDS is the 2D area detector that is a photon counter over a large area. With the sample mounted on an χ and Φ eucentric cradle so that the film is normal to the Φ axis. The cradle rotated about a vertical axis denoted as ω which changes the orientation of the χ axis in the horizontal plane. Basic advantage is speed and more diffraction information. At the same time, the 2D may provide the better accuracy due to less defocus in the collection process. Pole figure measurement on materials like thin polycrystalline films or multilayers may require long measurement times and a high directional resolution in the pole figures due to the low diffracted intensities and expected sharp textures. The most efficient diffraction diagrams were determined with area detectors ($XRD^2$). X-ray pole figures were acquired utilizing filtered copper optics. In order to characterize the crystallographic texture, three incomplete (0-90°) pole figures {001}, {100}, and {110} were measured. The macrotexture orientation distribution functions (ODFs) were calculated and visualized using integration software MulTEX.

The component description enabled an efficient concentration of grain orientation/texture information. A solution for the ODFs can be obtained which takes into account only the smallest necessary number of components. Estimates may be appropriate if the quality or quantity of measured data does not allow a precise calculation. The approach to determining texture components requires that the number of available pole figures and the measured ranges are large enough that any crystal orientation can be determined unambiguously. The least necessary amount of texture information in experimental pole figures only depends on crystal symmetry and the type of Miller indices of the diffracting lattice planes.

The volume fractions of the corresponding grain orientation/texture components were calculated using a spread of 15° from their ideal orientation. The overall intensity of the textures was characterized by the respective texture index T which was calculated as: $T = \oint [f(g)]^2 dg$ where f(g) is the orientation density function and g denotes the orientation

TABLE II

CVD Deposition of Coating Layers

| Process Step | $H_2$ vol. % | $N_2$ vol. % | $TiCl_4$ vol. % | $CH_3CN$ vol. % | $CH_4$ vol. % | $AlCl_3$ vol. % | $CO_2$ vol. % | CO vol. % | HCl vol. % | $H_2S$ vol. % |
|---|---|---|---|---|---|---|---|---|---|---|
| TiN | Bal. | 18.40 | 0.95 | — | — | — | — | — | — | — |
| MT-TiCN | Bal. | 27.8 | 1.31 | 0.001 | — | — | — | — | 1.40 | — |
| HT-TiCN | Bal. | 16.69 | 0.76 | — | 3.70 | — | — | — | — | — |
| TiOCN | Bal. | 17.50 | 1.08 | — | 2.52 | — | — | 1.10 | 1.10 | — |
| $Al_2O_3$ | Bal. | — | — | — | — | 4.84 | 2.42 | — | 3.00 | 0.10 | defined by the three Euler angles g=(φ1, Φ, φ2). Spherical texturecomponent (peak component) is the volume fraction, which does not depend on the rotation axis turningduring the X-ray diffraction collection.

For residual stress analysis, Pearson VII mode was employed for peak evaluation in the two-dimensional XRD, and stress tensors were derived based on a triaxial stress model. Diffraction rings (024), (116), (214) and (300) used for the residual stress calculations.

Figure 2:
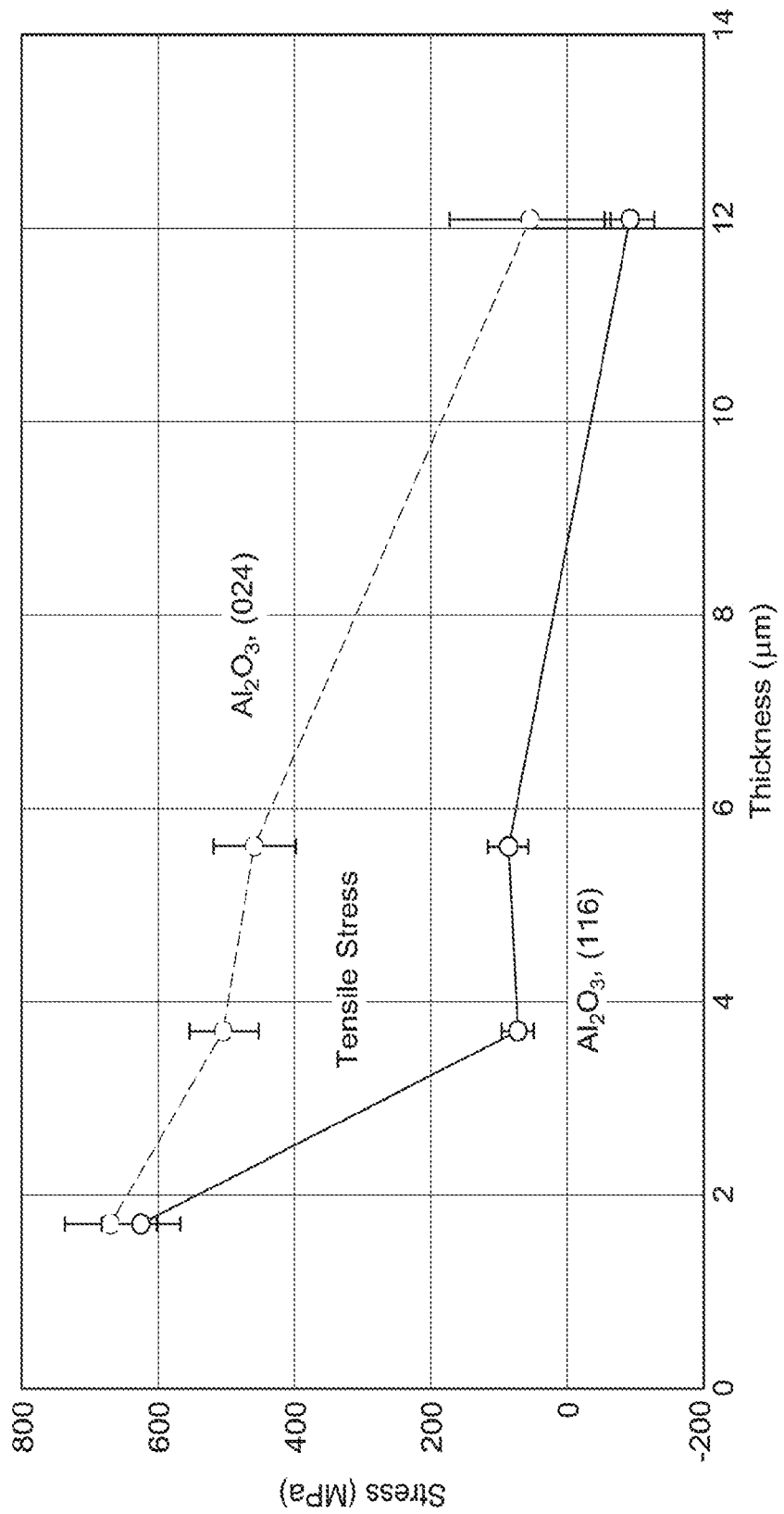
FIG. 2 illustrates residual stress evolution in an $Al_2O_3$ layer as a function of layer thickness, according to some embodiments.
Figure 3:
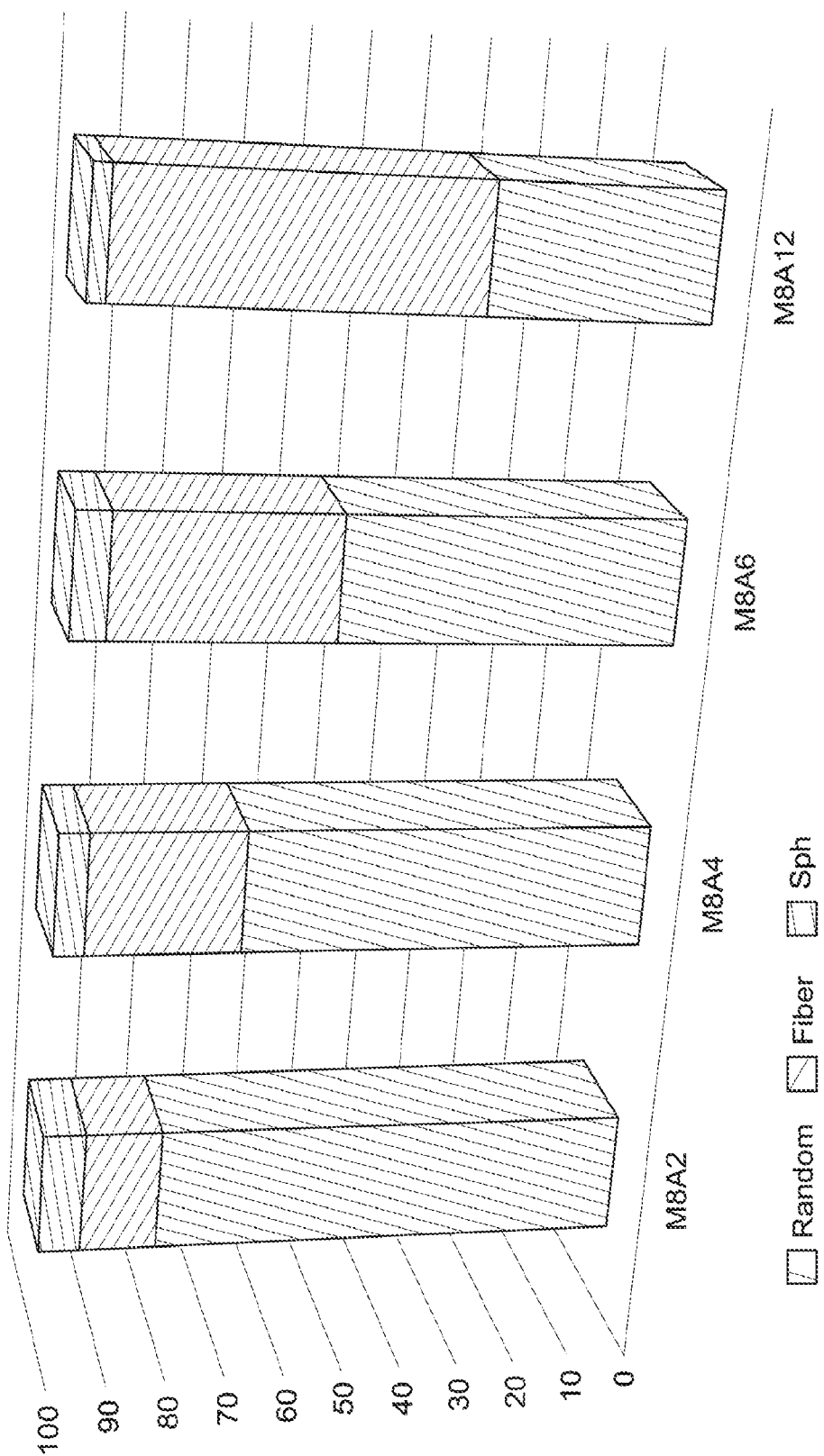
FIG. 3 illustrates grain orientation/texture evolution in an $Al_2O_3$ layer as a function of layer thickness, according to some embodiments.

FIG. 2 illustrates residual stress evolution in the $Al_2O_3$ layer with increasing thickness for the layer. According to this quantitative analysis by 2D XRD, residual stress in the $Al_2O_3$ layer can be controlled or set to the desired level based on control of layer thickness. FIG. 3 illustrates results of the grain orientation/texture analysis conducted on the $Al_2O_3$ layers of the coating samples via 2D X-ray diffraction. As set forth in FIG. 3, random orientation of the $Al_2O_3$ grains was reduced with increasing layer thickness. Additionally, fiber orientation of the $Al_2O_3$ grains increased with layer thickness. In view of these results, $Al_2O_3$ grain orientation/texture can be controlled with increasing $Al_2O_3$ layer thickness according the deposition parameters in Table II and III above.

Quantification of residual stress and grain orientation/texture of $Al_2O_3$ layers of the present example via 2D X-ray diffraction establishes the ability to control coating architectures via selection of appropriate coating depositions parameters. Notably, the quantitative nature of the 2D X-ray diffraction analysis enables reproducibility of the coating architectures and removes the subjective nature of current qualitative characterizations methods, such as the Harris formula. With the methods and compositions described herein, polycrystalline layer properties and associated performance can be elucidated and tailored for a number of coating applications, including high performance tooling applications involving cutting inserts and various rotary cutting tools.

Various embodiments of the invention have been described in fulfillment of the various objects of the invention. It should be recognized that these embodiments are merely illustrative of the principles of the present invention. Numerous modifications and adaptations thereof will be readily apparent to those skilled in the art without departing from the spirit and scope of the invention.

The invention claimed is:

1. A method of making a coated article comprising:
providing a substrate;
depositing a coating by chemical vapor deposition (CVD) or physical vapor deposition (PVD) on a surface of the substrate, the coating comprising at least one polycrystalline layer, wherein one or more CVD or PVD conditions are selected to induce one or more properties of the polycrystalline layer, and the one or more induced properties of the polycrystalline layer include grain orientation;
quantifying presence of the one or more properties in the polycrystalline layer via two-dimensional (2D) X-ray diffraction analysis; and
adjusting one or more CVD or PVD conditions in response to the quantification of the one or more properties by the 2D X-ray diffraction analysis, wherein
the one or more CVD or PVD conditions selected to induce one or more properties of the polycrystalline layers are selected from the following: reactant partial pressure, gas flow rate into the CVD reactor, gas flow rates out of the CVD reactor, CVD reactor temperature, deposition/growth rate of the polycrystalline layer, deposition time of the polycrystalline layer, cathode composition, substrate bias voltage, cathode arrangement relative to the substrate, cathode and/or substrate rotation, substrate temperature, and combinations thereof.

2. The method of claim 1, wherein the one or more deposition conditions are selected to control random grain orientation of the polycrystalline layer.

3. The method of claim 1, wherein less than 50 volume percent of the grains of the polycrystalline layer exhibit random orientation.

4. The method of claim 1, wherein the one or more deposition conditions are selected to control fiber grain orientation in the polycrystalline layer.

5. The method of claim 4, wherein greater than 30 volume percent of the grains of the polycrystalline layer exhibit fiber orientation.

6. The method of claim 1, wherein the one or more properties comprise preferred grain orientation.

7. The method of claim 6, wherein the one or more deposition conditions are selected to provide at least one preferred grain orientation of the polycrystalline layer.

8. The method of claim 7, wherein the at least one preferred orientation is the (006) growth direction.

9. The method of claim 1, wherein the one or more properties comprise residual stress of the polycrystalline layer.

10. The method of claim 9, wherein the residual stress of the polycrystalline layer is 0.2 GPa to −3 GPa.

11. The method of claim 1, wherein deposition time is adjusted.

12. The method of claim 1 further comprising quantifying the presence of the one or more properties via electron backscatter diffraction (EBSD).

13. The method of claim 1, wherein the polycrystalline layer is formed of refractory ceramic material selected from the group consisting of metal oxides, metal nitrides, metal carbides, metal carbonitrides, and metal oxycarbonitrides.

14. The method of claim 1, wherein the polycrystalline layer comprises one or more metallic elements selected from the group consisting of aluminum and metallic elements of Groups IVB, VB and VIB of the Periodic Table and one or more non-metallic elements selected from the group consisting of non-metallic elements of Groups IIIA, IV A, VA and VIA of the Periodic Table.

* * * * *